United States Patent
Pieh et al.

(10) Patent No.: US 8,350,257 B2
(45) Date of Patent: *Jan. 8, 2013

(54) WHITE ORGANIC LIGHT EMITTING DEVICE

(75) Inventors: Sung-Hoon Pieh, Seoul (KR); Chang-Oh Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 161 days.

This patent is subject to a terminal disclaimer.

(21) Appl. No.: 12/856,050

(22) Filed: Aug. 13, 2010

(65) Prior Publication Data
US 2011/0073844 A1    Mar. 31, 2011

(30) Foreign Application Priority Data
Sep. 29, 2009   (KR) .................. 10-2009-0092596

(51) Int. Cl.
*H01L 51/00* (2006.01)
*H01L 29/786* (2006.01)

(52) U.S. Cl. .......................................... 257/40; 257/79
(58) Field of Classification Search ............. 257/40, 257/79
See application file for complete search history.

(56) References Cited

U.S. PATENT DOCUMENTS

| | | | |
|---|---|---|---|
| 7,994,498 B2 * | 8/2011 | Pieh et al. | 257/40 |
| 2008/0290236 A1 * | 11/2008 | Sakamoto et al. | 248/309.1 |
| 2008/0297036 A1 * | 12/2008 | Noh et al. | 313/504 |
| 2008/0315753 A1 * | 12/2008 | Liao et al. | 313/504 |

* cited by examiner

*Primary Examiner* — Howard Weiss
*Assistant Examiner* — Steven Rao
(74) *Attorney, Agent, or Firm* — Morgan, Lewis & Bockius LLP

(57) ABSTRACT

A white organic light emitting device having a stack structure of blue fluorescence and red/green phosphorescence is disclosed, in which efficiency of the blue fluorescence is improved to increase lifespan of the white organic light emitting device, color quality is improved, and power consumption is reduced.

9 Claims, 12 Drawing Sheets

WHITE ORGANIC LIGHT EMITTING DEVICE

This application claims the benefit of the Patent Korean Application No. 10-2009-92596, filed on Sep. 29, 2009, which is hereby incorporated by reference as if fully set forth herein.

BACKGROUND OF THE INVENTION

1. Field of the Invention

The present invention relates to an organic light emitting device, and more particularly, to a white organic light emitting device having a stack structure of blue fluorescence and red/green phosphorescence, in which efficiency of the blue fluorescence is improved to increase lifespan of the white organic light emitting device, color quality is improved, and power consumption is reduced.

2. Discussion of the Related Art

Recently, with the advent of the age of information, a display field that visually displays an electrical information signal has been rapidly developed. In this respect, various flat display devices having excellent performance such as thin profile, lightness in weight, and low power consumption have been developed to quickly substitute for an existing Cathode Ray Tube (CRT).

Examples of the flat display devices include a liquid crystal display device (LCD), a plasma display panel device (PDP), a field emission display device (FED), and an organic light emitting device (OLED).

Of the flat display devices, the organic light emitting device that does not require a separate light source is considered as a competitive application for compact size of the device and display of a clear color.

This organic light emitting device necessarily needs an organic light emitting layer. In the related art, a deposition method using a shadow mask has been used to form the organic light emitting layer.

However, in case of a shadow mask having a large area, sag may occur due to load of the shadow mask. For this reason, it is difficult to use the shadow mask several times, and a defect occurs in forming a pattern of the organic light emitting layer. In this respect, various solutions for substituting for the shadow mask have been suggested. One of the solutions is a white organic light emitting device.

Hereinafter, the white organic light emitting device will be described below.

The white organic light emitting device is characterized in that each layer between a cathode and an anode is deposited without any mask when forming a light emitting diode. In this case, organic layers including an organic light emitting layer are deposited in due order under the vacuum state by varying their components.

The white organic light emitting device has various purpose of uses such as a full color display device having color filter, a backlight of a liquid crystal display device, or a thin light source.

The white organic light emitting device includes a plurality of light emitting layers having different colors. In this case, dopants included in each light emitting layer have different colors. However, a problem occurs in that there is a limitation in components of the dopant included in the corresponding light emitting layer due to properties of the dopant. Also, as the respective light emitting layers are mixed with one another to obtain white light, a peak value is obtained at a wavelength of a color other than red, green and blue, whereby a color reproduction rate is deteriorated when a color filter is provided. Moreover, a problem occurs in that a color shift occurs due to the difference in lifespan among the dopants when the dopants continue to be used.

Moreover, as similar energy levels occur in the boundary between a light emitting layer and a hole transport layer, a problem occurs in that a triplet exciton moves to the hole transport layer over the boundary and thus light emitting efficiency of excited state is deteriorated. In order to solve this problem, an exciton blocking layer (EBL) may be provided. In this case, driving voltages and process steps are increased and lifespan is reduced. This could lead to many problems in obtaining a white organic light emitting device having proper efficiency.

The white organic light emitting device according to the related art includes light emitting layers which are deposited with either a fluorescent structure or a stack structure of blue fluorescent layer and red/green phosphor layers in view of lifespan and power consumption. In this case, the two structures have a common feature in that a blue fluorescent layer of a singlet exciton is used.

In view of the recent technical level, efficiency of the blue phosphor layer has reached a satisfactory level. However, improvement is still required in view of lifespan. For this reason, a white organic light emitting device having a blue fluorescent layer has been mainly developed but is restrictive due efficiency problem in view of color temperature, lifespan and power consumption. In particular, in order to solve this problem, a method for improving efficiency and lifespan of a blue fluorescent layer having a restrictive internal quantum efficiency rate of 25% is required.

SUMMARY OF THE INVENTION

Accordingly, the present invention is directed to a white organic light emitting device that substantially obviates one or more problems due to limitations and disadvantages of the related art.

An object of the present invention is to provide a white organic light emitting device having a stack structure of blue fluorescence and red/green phosphorescence, in which efficiency of the blue fluorescence is improved to increase lifespan of the white organic light emitting device, color quality is improved, and power consumption is reduced.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a white organic light emitting device of the present invention comprises an anode and a cathode facing each other on a substrate; a charge generation layer formed between the anode and the cathode; a first stack formed between the anode and the charge generation layer in a stack structure of a first hole transport layer, a first light emitting layer emitting blue, a first electron transport layer and an electron transport catalyst layer doped with metal; and a second stack formed between the charge generation layer and the cathode in a stack structure of a second hole transport layer, a second light emitting layer, and a second electron transport layer, the second light emitting layer doped with phosphor red and green dopants in one host, and the second hole transport layer having an energy level higher than a triplet exciton energy level of the second light emitting layer.

Preferably, the second hole transport layer is set to energy level higher than the triplet exciton energy level of the second light emitting layer as much as 0.01~0.4 eV.

Preferably, the first hole transport layer is set to energy level higher, than a triplet exciton energy level of the first light emitting layer as much as 0.01~0.4 eV.

The first electron transport layer is set to energy level higher than the triplet exciton energy level of the first light emitting layer as much as 0.01~0.4 eV, and the second electron transport layer is set to energy level higher than the triplet exciton energy level of the second light emitting layer as much as 0.01~0.4 eV.

The first light emitting layer includes a blue host having a blue dopant emitting blue.

The first electron transport catalyst layer is selected from a material that minimizes metal diffusion to the first light emitting layer and has high triplet energy level, and the first electron transport layer is selected from an organic matter that enables electron injection through metal doping.

The first electron transport layer is a bphen based organic matter.

Meanwhile, the metal doped in the electron transport catalyst layer includes at least any one of alkali metal, MoOx, WOx, and $V_2O_5$.

The first stack has lifespan longer than that of the second stack, and preferably has cool white color property according to aging.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3b is a graph illustrating luminance according to wavelength depending on variation in amount of a green dopant in a structure of FIG. 3a;

FIG. 4b is a graph illustrating luminance according to wavelength depending on variation in amount of a red dopant in a structure of FIG. 4a;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
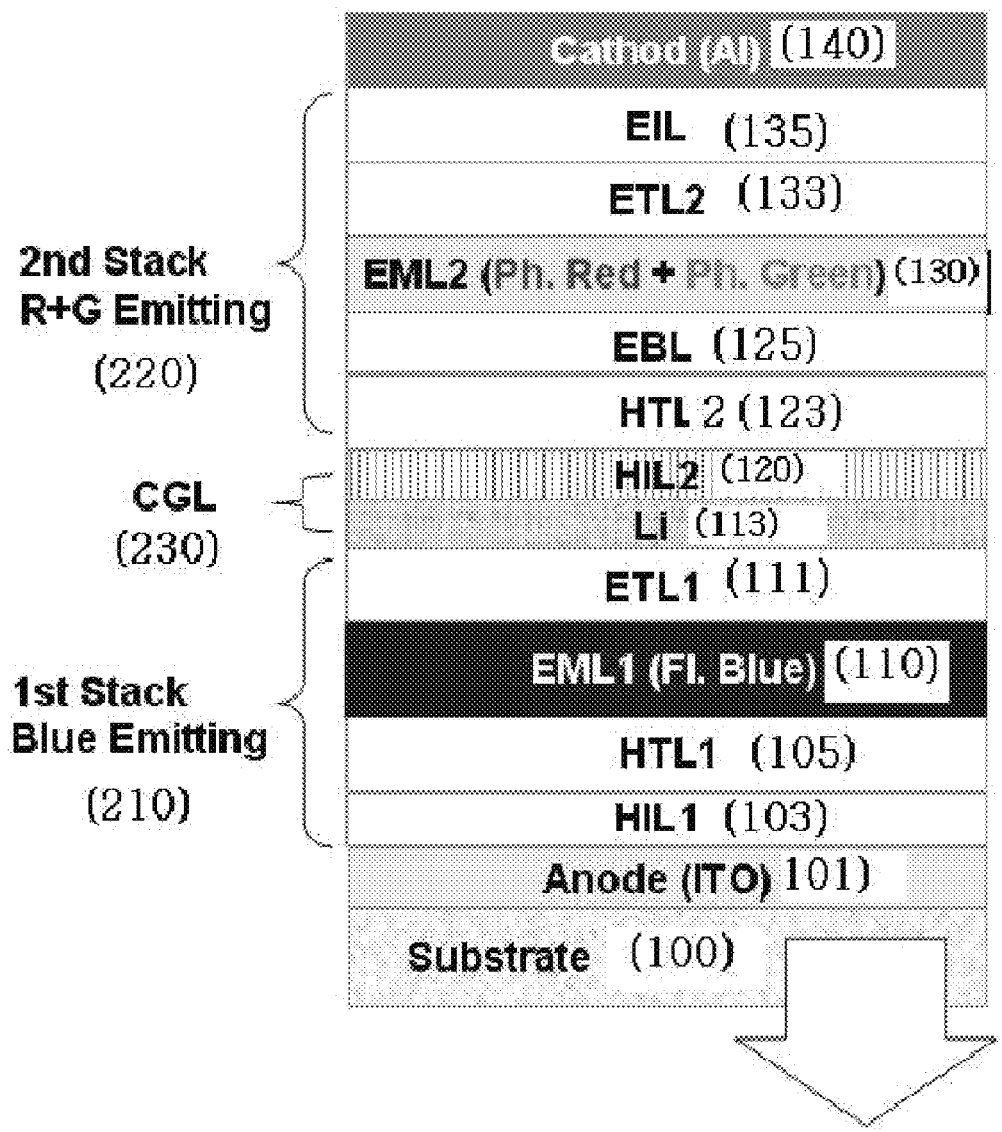
FIG. 1 is a sectional view illustrating an example of a white organic light emitting device according to the present invention.

FIG. 1 is a sectional view illustrating an example of a white organic light emitting device according to the present invention.

As shown in FIG. 1, a white organic light emitting device according to the present invention includes an anode 101 and a cathode 140 facing each other on a substrate 100, a first stack 210 deposited between the anode 101 and the cathode 140, a charge generation layer (CGL) 230, and a second stack 220.

The charge generation layer 230 includes a stack structure of a metal layer 113 and a second hole injection layer 120 from the bottom.

The anode 101 is formed of a transparent electrode such as ITO (indium tin oxide). The cathode 140 is formed of a reflective metal such as Al. In this case, image is downwardly emitted based on the drawing of light emitting efficiency of the first and second stacks 210 and 220.

The first stack 210 includes a first hole injection layer 103, a first hole transport layer 105, a first light emitting layer 110, and a first electron transport layer 111, which are deposited in due order between the upper portion of the anode 101 and the charge generation layer 230. The second stack 220 includes a second hole transport layer 135, an exciton blocking layer (EBL) 125, a second light emitting layer 130, a second electron transport layer 133, and an electron injection layer 135, which are deposited in due order between the charge generation layer 230 and the cathode 140.

In this case, the first light emitting layer 110 includes a single blue host having a blue fluorescent dopant, and the second light emitting layer 130 is a single light emitting layer that includes a single host having phosphorescence green and phosphorescence red dopants.

In this case, when the white organic light emitting device is driven, white light can be obtained by combination of light emitted by the first light emitting layer 110 and the second light emitting layer 130.

The second hole transport layer 123 is set to have an energy level higher than triplet exciton energy level of the second light emitting layer 130. Preferably, the second hole transport layer 123 is set to energy level higher than the triplet exciton energy level of the second light emitting layer 130 as much as 0.01~0.4 eV. At this time, since the second hole transport layer 123 has energy level higher than that of the second light emitting layer 130, the triplet exciton of the second light emitting layer 130 is prevented from moving to the second hole transport layer 123, so as not to deteriorate light emitting efficiency. In other words, the second hole transport layer 123 performs a hole transport function from the second light emitting layer 130, and the exciton blocking layer 125 above the second hole transport layer 123 serves to prevent triplet exciton from being moved from the second light emitting layer 130.

Figure 2:
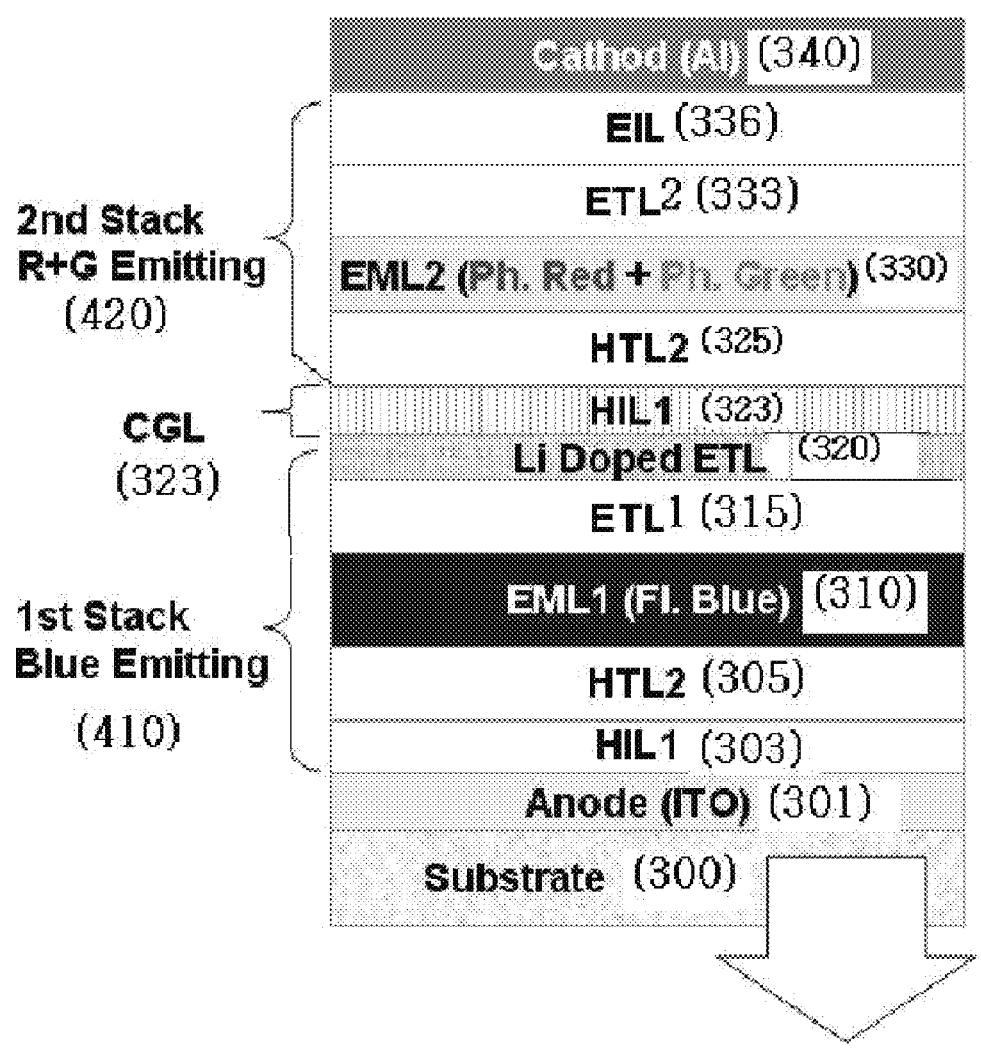
FIG. 2 is a sectional view illustrating another example of a white organic light emitting device according to the present invention, having improved lifespan.

FIG. 2 is a sectional view illustrating another example of a white organic light emitting device according to the present invention, having improved lifespan.

As shown in FIG. 2, in another structure of a white organic light emitting device according to the present invention as compared with the structure of FIG. 1, an exciton blocking layer (EBL) is omitted, and the charge generation layer (CGL) is formed of a single layer of a second hole transfer layer. Also, a first electron transfer layer of a first stack 410 below the charge generation layer includes an electron transport catalyst layer 320 and a first electron transport layer 315, which are deposited in due order to adjoin the second hole transfer layer.

In other words, as shown in FIG. 2, the white organic light emitting device according to another embodiment of the present invention includes an anode 301 and a cathode 340 facing each other on a substrate 300, a first stack 410 deposited between the anode 301 and the cathode 340, a charge generation layer (CGL) 323, and a second stack 420.

The anode 301 is formed of a transparent electrode such as ITO (indium tin oxide). The cathode 340 is formed of a reflective metal such as Al. In this case, image is downwardly emitted based on the drawing of light emitting efficiency of the first and second stacks 410 and 420.

The first stack 410 includes a first hole injection layer (HIL) 303, a first hole transport layer (HTL) 305, a first light emitting layer 310, and a first electron transport layer (ETL) 315, which are deposited in due order between the upper portion of the anode 301 and the charge generation layer 330. The second stack 420 includes a second hole transport layer 335, a second light emitting layer 330, a second electron transport layer 333, and an electron injection layer 335, which are deposited in due order between the charge generation layer 323 and the cathode 340.

In this case, the first light emitting layer 310 includes a single blue host having a blue fluorescent dopant, and the second light emitting layer 330 is a single light emitting layer that includes a single host having phosphorescence green and phosphorescence red dopants. As the case may be, the first light emitting layer 310 may be formed of a blue phosphor layer in addition to a blue fluorescent layer. However, the first light emitting layer 310 formed of a blue fluorescent material considering lifespan will be described in the following experiments.

Also, the electron transport catalyst layer 320 is formed of an organic matter that includes at least any one of alkali metal, such as Li, MoOx, WOx, and $V_2O_5$. The electron transport catalyst layer 320 has an electron transport function, and is located between the first electron transport layer 315 and the charge generation layer 323. At this time, the first electron transport catalyst layer 320 is selected from a material that minimizes alkali metal diffusion to the first light emitting layer 310 and has a high triplet energy level.

Also, the first electron transport layer 315 is selected from an organic matter that enables electron injection through alkali metal doping. For example, the first electron transport layer 315 is selected from a bphen based organic matter.

Meanwhile, the second hole transport layer 325 is set to energy level higher than the triplet exciton energy level of the second light emitting layer 330 as much as 0.01~0.4 eV. At this time, it is preferable that the first hole transport layer 315 below the second hole transport layer 325 is also set to energy level higher than triplet exciton energy level of the first light emitting layer 310 as much as 0.01~0.4 eV.

Likewise, it is preferable that the first electron transport layer 315 is also set to energy level higher than triplet exciton energy level of the first light emitting layer 310 as much as 0.01~0.4 eV, and the second electron transport layer 333 is also set to energy level higher than triplet exciton energy level of the second light emitting layer 330 as much as 0.01~0.4 eV. The first and second hole transport layers 305 and 325 and the second electron transport layers 315 and 333 of the upper and lower boundaries of the first and second light emitting layers 310 and 330 have the energy levels than those of the first and second light emitting layers 310 and 330, so that each exciton and triplet exciton are prevented from being moved from the first and second light emitting layers 310 and 330 to the upper and lower boundaries, and thus are used for light emission if possible.

In this case, when the white organic light emitting device is driven, white light can be obtained by combination of light emitted by the first light emitting layer 310 and the second light emitting layer 330.

The second hole transport layer 325 is set to have energy level higher than the triplet exciton energy level of the second light emitting layer 330. In this case, it is preferable that the second hole transport layer 325 is set to have energy level higher than the triplet exciton energy level of the second light emitting layer 330 as much as 0.01~0.4 eV. At this time, since the second hole transport layer 325 has energy level higher than that of the second light emitting layer 330, the triplet exciton of the second light emitting layer 330 is prevented from moving to the second hole transport layer 325, so as not to deteriorate light emitting efficiency. In other words, the second hole transport layer 325 performs a hole transport function from the second light emitting layer 330, and also serves as the exciton blocking layer that prevents triplet exciton from being moved from the second light emitting layer 330.

In the aforementioned white organic light emitting device according to another embodiment of the present invention, efficiency and lifespan of the first stack that includes a blue fluorescent light emitting layer are improved, whereby color temperature, efficiency and lifespan of the device can be improved.

Also, lifespan of the first stack 410 becomes longer than that of the second stack 420, and cool white (cool white means a phenomenon that blue is seen strongly) color property can be obtained due to aging.

In this case, the blue fluorescent light emitting layer has internal quantum efficiency of 25%. However, the second hole transport layer 325 having a high triplet energy is provided and the catalyst layer 320 doped with metal is also provided between the charge generation layer 323 and the first electron transport layer 315, so as to obtain optimized charge balance and improve internal quantum efficiency of 37.6%, which is a theoretical value, using the triplet-triplet annihilation. As a result, lifespan has been improved twice or more than that of the structure of the aforementioned embodiment.

Hereinafter, optimized conditions such as dopant contents of the first and second light emitting layers of the white organic light emitting device according to another embodiment will be described.

Figure 3A:
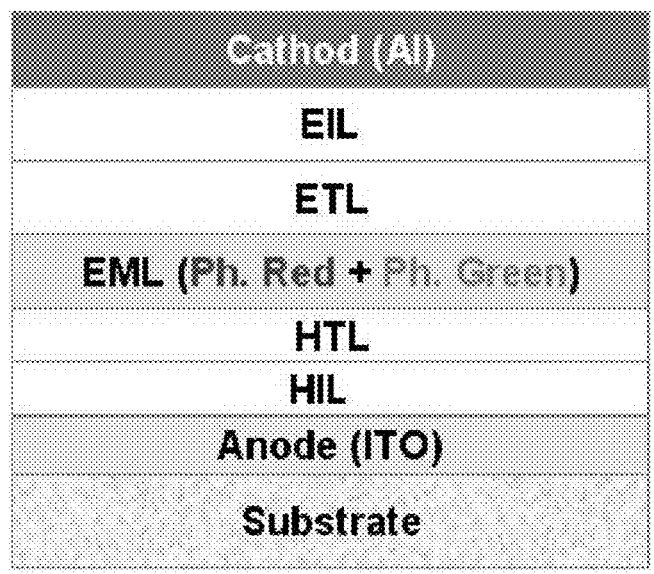
FIG. 3a is a sectional view illustrating an organic light emitting device that includes red/green phosphor light emitting layers.
Figure 3B:
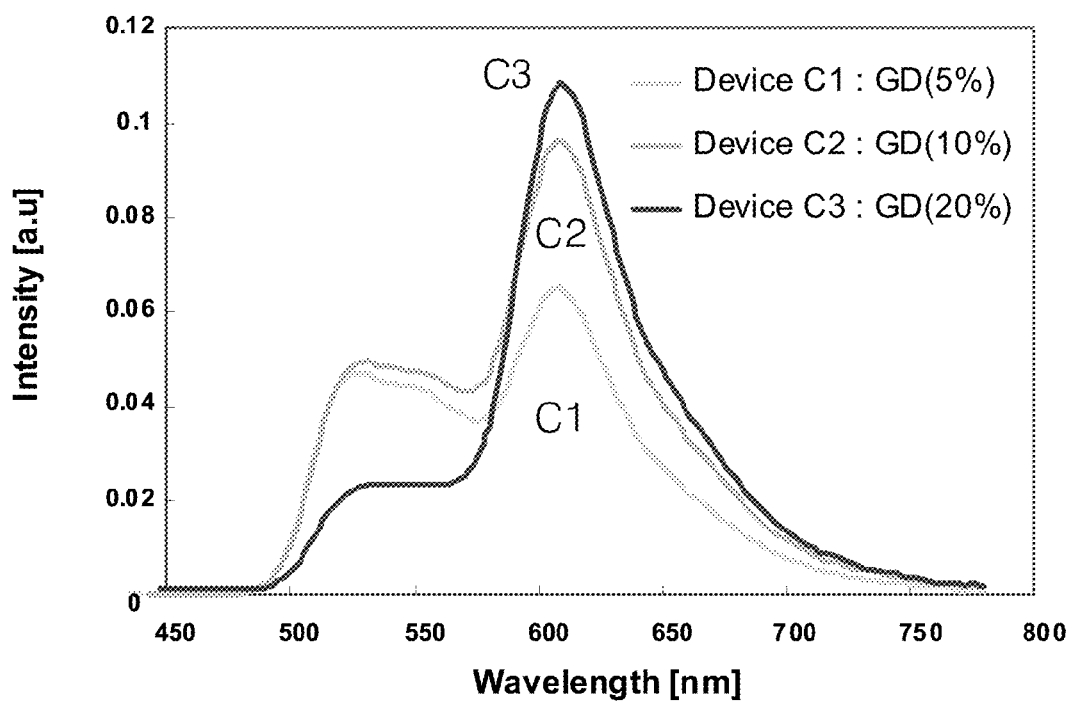

FIG. 3a is a sectional view illustrating an organic light emitting device that includes red/green phosphor light emitting layers, and FIG. 3b is a graph illustrating luminance according to wavelength depending on variation in amount of a green dopant in a structure of FIG. 3a.

In other words, the structure of FIG. 3a corresponds to the second stack of FIG. 2 and includes a light emitting layer including a single host having phosphor red and green dopants. FIG. 3b illustrates a spectrum according to a green dopant ratio to a red dopant.

As shown in FIG. 3B and Table 1, in a state that a red phosphor dopant of 0.4% is contained in the green host, when contents of a green phosphor dopant are 5%, 10%, and 20%, a driving voltage V, light intensity cd/A, external quantum efficiency (CQE) (%) and CIE coordinate system are measured.

For example, in a state that the content of the green host and the red phosphor dopant are fixed to 0.4%, when the contents of the green phosphor dopant are 5% and 10%, the driving voltage was 3.6V. When the content of the green phosphor dopant is 20%, the driving voltage was 3.7V. In this case, it is noted that the driving voltage is increased when the content of the green phosphor dopant is increased.

However, light intensity cd/A and external quantum efficiency EQE have the maximum values when the green phosphor dopant is 10%. When the green phosphor dopant is maintained at 10%, it is noted that the driving voltage is not increased and the optimized light intensity and quantum efficiency are obtained.

In particular, in FIG. 3b, when the content of the green phosphor dopant is 5%, relatively high intensity occurs at a wavelength bandwidth near 600 nm and a wavelength bandwidth of 530 nm. However, a problem occurs in that quantum efficiency is not high due to small intensity. When the content of the green phosphor dopant is 20%, high intensity occurs at a wavelength bandwidth near 600 nm but remarkably low intensity occurs at the other wavelengths, whereby red/green light emission cannot be performed.

Accordingly, it is noted from FIG. 3b and FIG. Table 1 that efficiency of the driving voltage is good and red/green light occurs appropriately when the green dopant is 10% in the stack structure that includes a light emitting layer having red/green phosphor dopants.

TABLE 1

|  | EML | V | cd/A | EQE(%) | CIEx | CIEy |
|---|---|---|---|---|---|---|
| C-1 | GH + RD(0.4%) + GD(5%) | 3.6 | 30.0 | 13.5% | 0.477 | 0.504 |
| C-2 | GH + RD(0.4%) + GD(10%) | 3.6 | 36.4 | 17.8% | 0.507 | 0.478 |
| C-3 | GH + RD(0.4%) + GD(20%) | 3.7 | 27.8 | 16.6% | 0.565 | 0.419 |

Figure 4A:
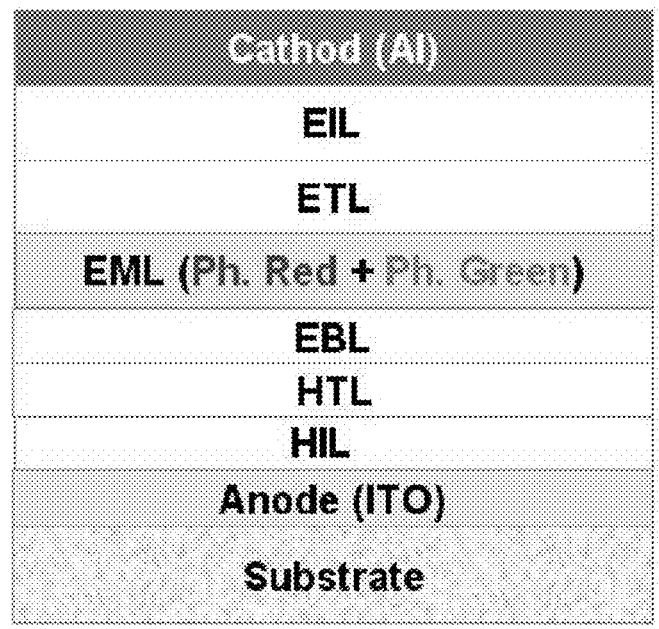
FIG. 4a is a sectional view illustrating an organic light emitting device that includes an exciton blocking layer and red/green phosphor light emitting layers.
Figure 4B:
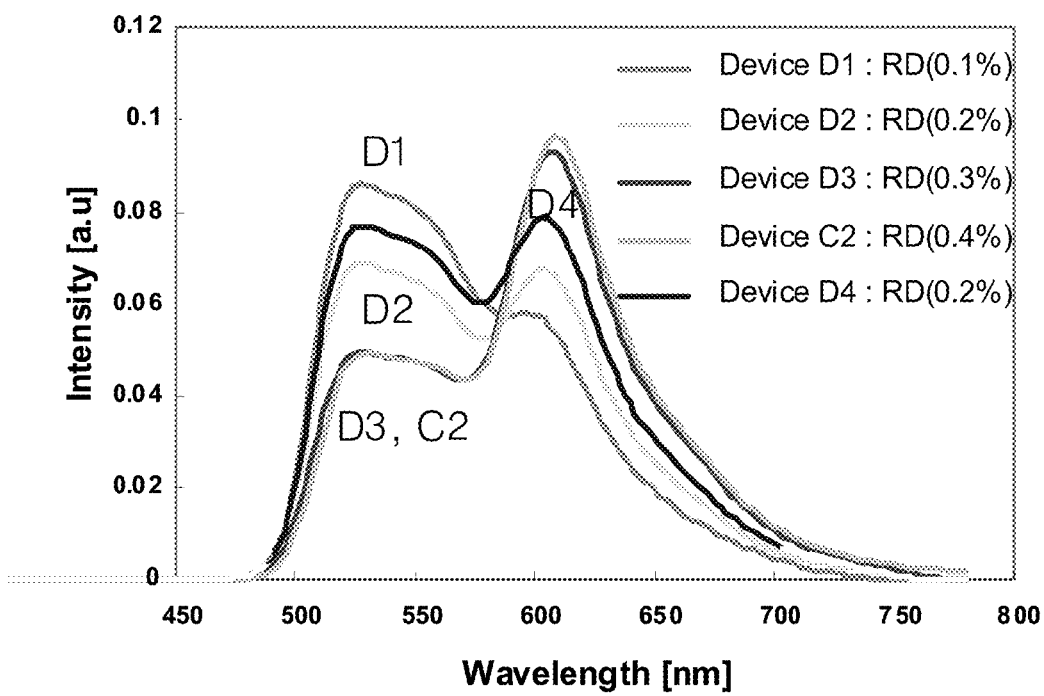

FIG. 4a is a sectional view illustrating an organic light emitting device that includes an exciton blocking layer and red/green phosphor light emitting layers, and FIG. 4b is a graph illustrating luminance according to wavelength depending on variation in amount of a red dopant in a structure of FIG. 4a.

FIG. 4a also illustrates a stack structure that includes red/green phosphor light emitting layers. In the experiment of Table 2 and FIG. 4b, the green phosphor dopant 10% is contained in the green host, and the content of the red phosphor dopant is varied and IVL data and intensity according to wavelength are measured. In this case, the exciton blocking layer (EBL) is further provided between the red/red phosphor light emitting layers and the hole transport layer (HTL).

In other words, Table 2 illustrates that the driving voltage is increased as much as the increased content of the red phosphor dopant when the red phosphor dopant is contained from 0.1% to 0.4% by increasing by 0.1% in the structure having no excition blocking layer. However, it is noted that quantum efficiency is not increased as much as the increased driving voltage.

It is noted that quantum efficiency is rapidly increased to 19.4% in case of the driving voltage of 3.8V when the exciton blocking layer is provided and the content of the red phosphor dopant having the lowest quantum efficiency in the structure having no exciton blocking layer is 0.2%. In this case, light efficiency is relatively better than that of the structure having no exciton blocking layer.

As shown in the exciton blocking layer (triplet blocking layer) marked with white of the graph of FIG. 4b, it is noted that uniform intensity occurs at the wavelengths of 600 nm and 530 nm.

TABLE 2

|  | EBL | EML | V | cd/A | EQE(%) | CIEx | CIEy |
|---|---|---|---|---|---|---|---|
| D-1 | x | GH + RD(0.1%) + GD(10%) | 3.5 | 44.8 | 16.2% | 0.411 | 0.562 |
| D-2 | x | GH + RD(0.2%) + GD(10%) | 3.4 | 39.9 | 16.0% | 0.445 | 0.532 |
| D-3 | x | GH + RD(0.3%) + GD(10%) | 3.6 | 36.5 | 17.4% | 0.501 | 0.482 |
| C-3 | x | GH + RD(0.4%) + GD(10%) | 3.7 | 27.8 | 16.6% | 0.565 | 0.419 |
| D-4 | 0 | GH + RD(0.2%) + GD(10%) | 3.8 | 48.1 | 19.4% | 0.449 | 0.529 |

However, if the excition blocking layer is provided, a problem occurs in that lifespan is reduced. Accordingly, it is considered that properties such as light intensity and quantum efficiency are improved in view of another aspect in addition to the exition blocking layer.

Figure 5A:
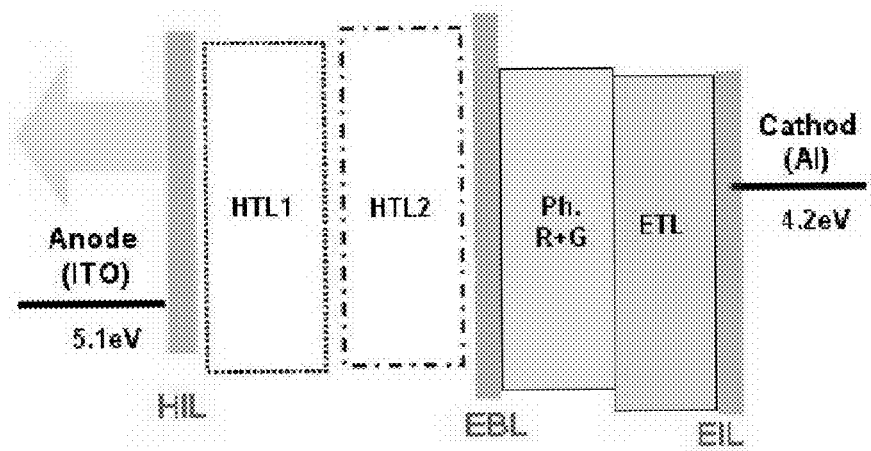
FIG. 5a is a sectional view illustrating a stack structure of an organic light emitting device that includes red/green phosphor light emitting layers.
Figure 5B:
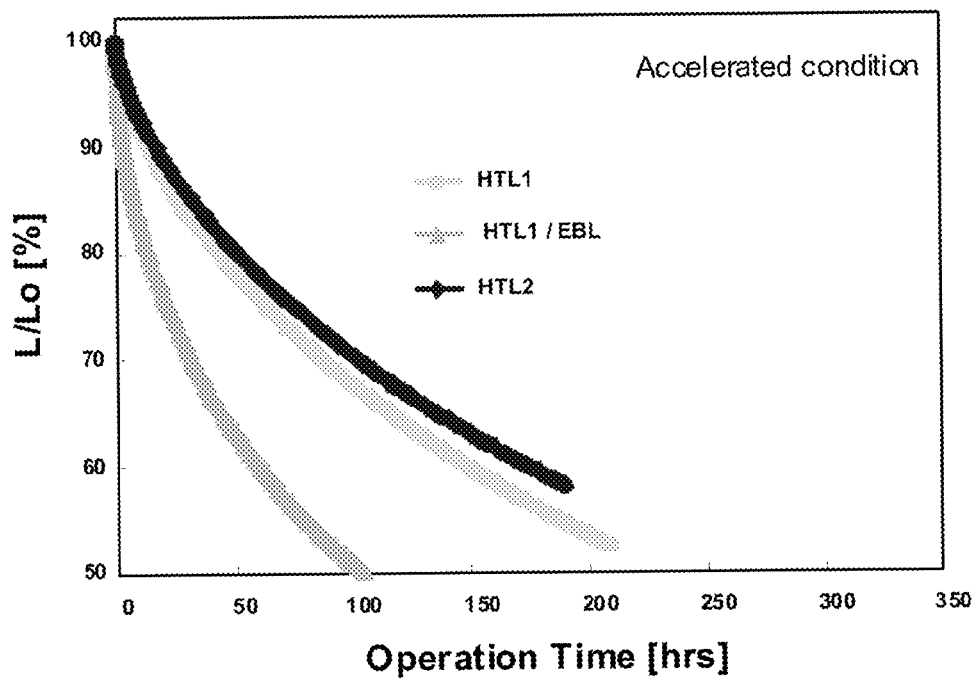
FIG. 5b is a graph illustrating lifespan of red/green phosphor light emitting layers.

FIG. 5a is a sectional view illustrating a stack structure of an organic light emitting device that includes red/green phosphor light emitting layers, and FIG. 5b is a graph illustrating lifespan of red/green phosphor light emitting layers.

As shown in FIG. 5a, the stack structure that includes red/green phosphor light emitting layers includes a first hole transport layer (HTL1), red/green phosphor light emitting layers, and an electron transport layer (ETL) in due order between the anode and the cathode. At this time, the first hole transport layer has exciton energy lower than or equal to that of the light emitting layer as the case may be.

The exciton blocking layer may further be provided between the first hole transport layer and the red/green phosphor light emitting layer as the case may be. Alternatively, the first hole transport layer may be replaced with the second hole transport layer having exciton energy level higher than that of the red/green phosphor light emitting layer as much as 0.01~0.4 eV.

The graph of FIG. 5b illustrates lifespan of each of the examples of FIG. 5. In this case, it is noted that lifespan is lowered when the exciton blocking layer is used. Unlike this, if a single layer of the first hole transport layer or the second hole transport layer is provided, it is noted that lifespan is improved two times as compared with the example that the exciton blocking layer is used.

However, as shown in Table 3, if the first hole transport layer is provided, quantum efficiency or light intensity is remarkably deteriorated as compared with that the exciton blocking layer is provided. Accordingly, it is not preferable that the first hole transport layer is used in view of lifespan only. If the second hole transport layer is used, it is noted that quantum efficiency and light intensity are improved as compared with that the first hole transport layer is provided.

Accordingly, it is preferable that the second hole transport layer is used considering lifespan, luminance and quantum efficiency.

TABLE 3

| HTL | Volt(V) | Cd/A | EQE(%) | CIEx | CIEy |
|---|---|---|---|---|---|
| HTL1 | 3.4 | 39.9 | 16.0% | 0.445 | 0.532 |
| HTL1/EBL | 3.4 | 48.1 | 19.4% | 0.449 | 0.529 |
| HTL2 | 3.6 | 43.4 | 17.9% | 0.456 | 0.521 |

Figure 6A:
FIG. 6a and FIG. 6b are sectional views illustrating another example of a stack structure of an organic light emitting device that includes a blue fluorescent light emitting layer.
Figure 6B:
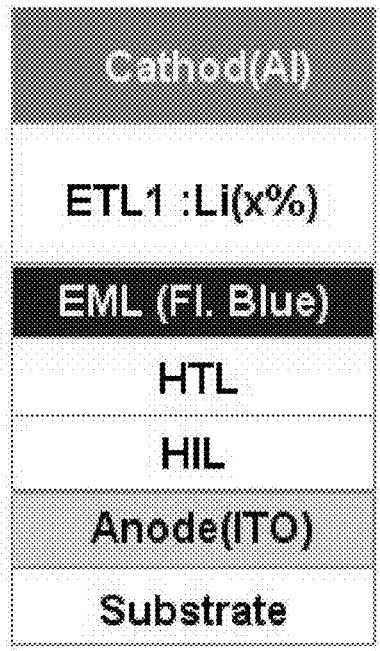
Figure 7:
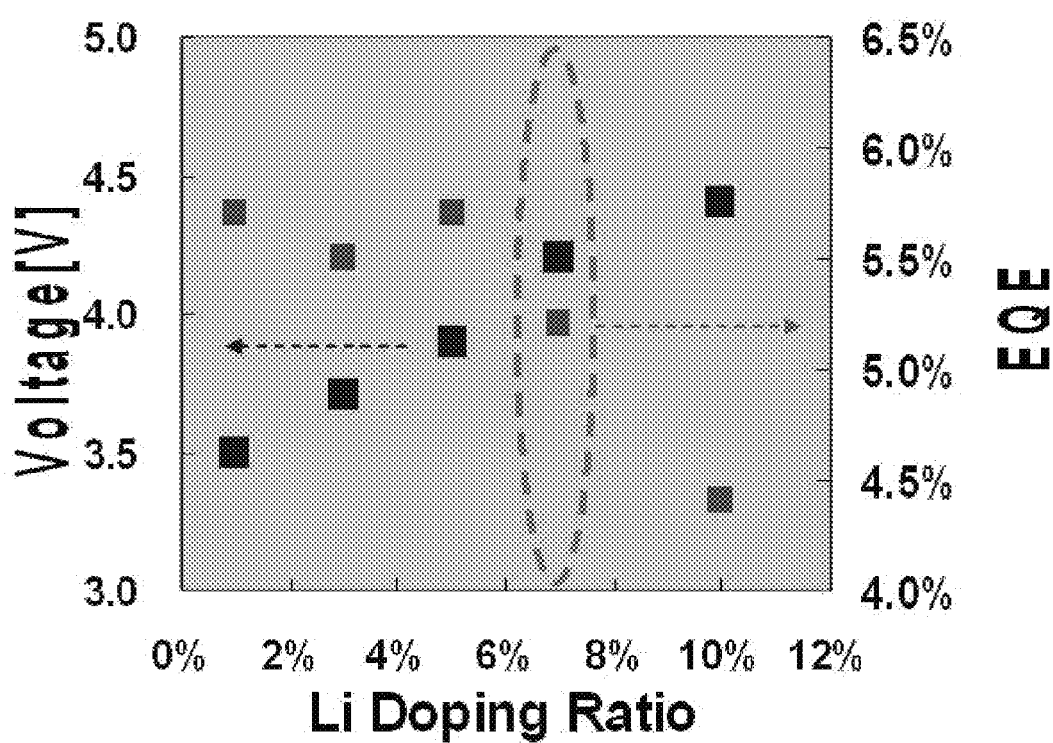
FIG. 7 is a graph illustrating IVL data according to density of an electron transport catalyst layer.
Figure 8:
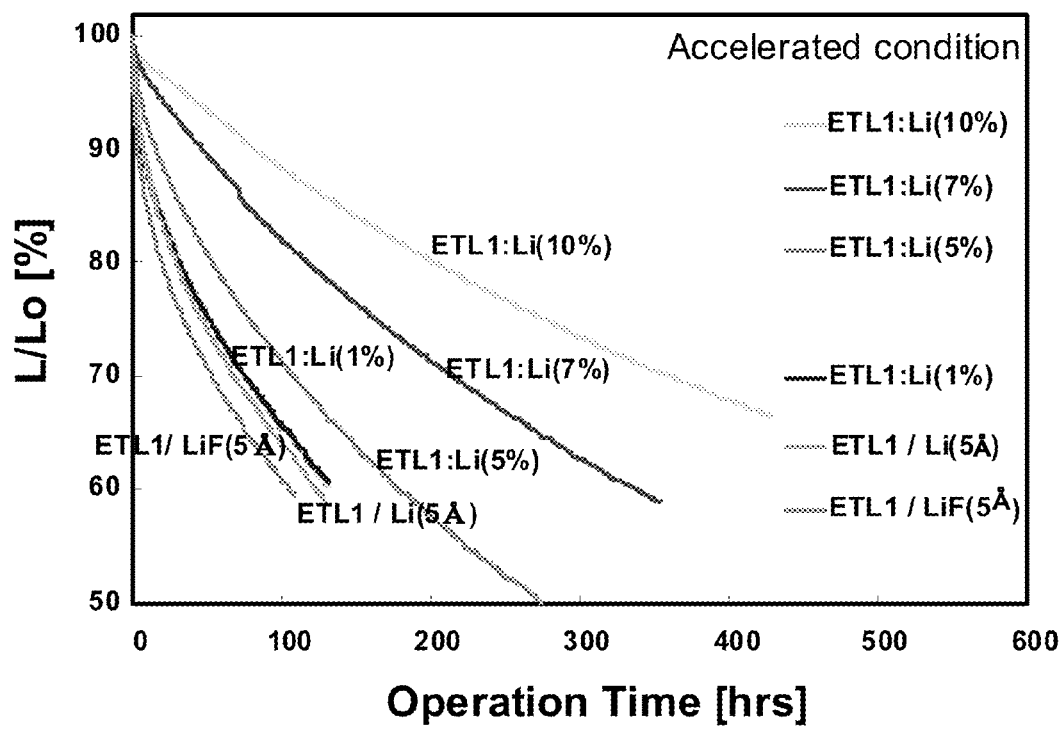
FIG. 8 is a graph illustrating lifespan when Li or LiF has different densities in a structure of FIG. 6a and FIG. 6b.

FIG. 6a and FIG. 6b are sectional views illustrating another example of a stack structure of an organic light emitting device that includes a blue fluorescent light emitting layer, and FIG. 7 is a graph illustrating IVL data according to density of an electron transport catalyst layer. Also, FIG. 8 is a graph illustrating lifespan when Li or LiF has different densities in a structure of FIG. 6a and FIG. 6b.

FIG. 6a illustrates a single layer of an electron transport layer (ETL) in a stack structure that includes a blue fluorescent light emitting layer. FIG. 6b illustrates a double layer of an electron transport layer and an electron transport catalyst layer (Li(x %)) doped with metal (alkali metal such as Li).

In FIG. 6a and FIG. 6b, a substrate, an anode (ITO), a hole injection layer (HIL), and a hole transport layer (HTL) are deposited below the blue fluorescent light emitting layer (EML: Fl. Blue).

As shown in Table 4 and FIG. 7, it is noted that the driving voltage is increased when a doping content of Li is increased in case of the double layer of FIG. 6b but quantum efficiency is reduced to a component ratio of 7%.

However, as shown in FIG. 8, it is noted that if the doping content of Li is increased, quantum efficiency is reduced but lifespan is relatively increased. It is noted that optimized quantum efficiency of 5.2% and lifespan are obtained when the doping content of Li of the electron transport catalyst layer is about 7% considering quantum efficiency and lifespan.

TABLE 4

| | Structure | Volt(V) | Cd/A | EQE(%) | CIEx | CIEy |
|---|---|---|---|---|---|---|
| Li doped ETL | ETL1:Li(10%) | 4.4 | 4.7 | 4.4% | 0.133 | 0.159 |
| | √ETL1:Li(7%) | 4.2 | 5.6 | 5.2% | 0.133 | 0.160 |
| | ETL1:Li(5%) | 3.9 | 6.1 | 5.7% | 0.134 | 0.159 |
| | ETL1:Li(3%) | 3.7 | 5.9 | 5.5% | 0.134 | 0.159 |
| | ETL1:Li(1%) | 3.5 | 6.0 | 5.7% | 0.134 | 0.157 |
| Single ETL | ETL1/Li | 3.8 | 5.8 | 5.6% | 0.133 | 0.155 |
| | ETL1/LiF | 3.7 | 5.7 | 5.5% | 0.133 | 0.153 |

Figure 9A:
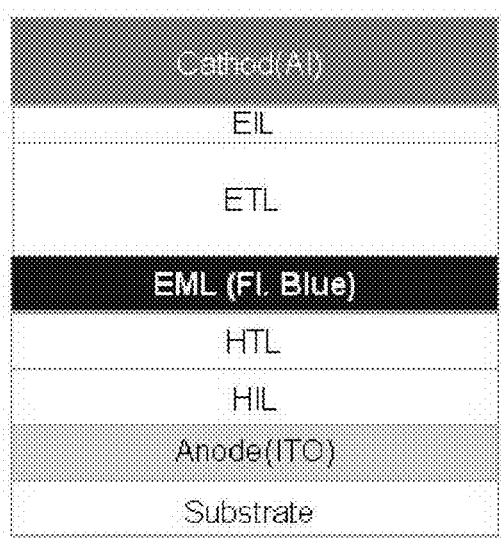
FIG. 9a and FIG. 9b are sectional views illustrating a single electron transport layer structure and a stack structure of an electron transport layer and an electron transport catalyst layer in an organic light emitting device that includes a blue fluorescent light emitting layer.
Figure 9B:
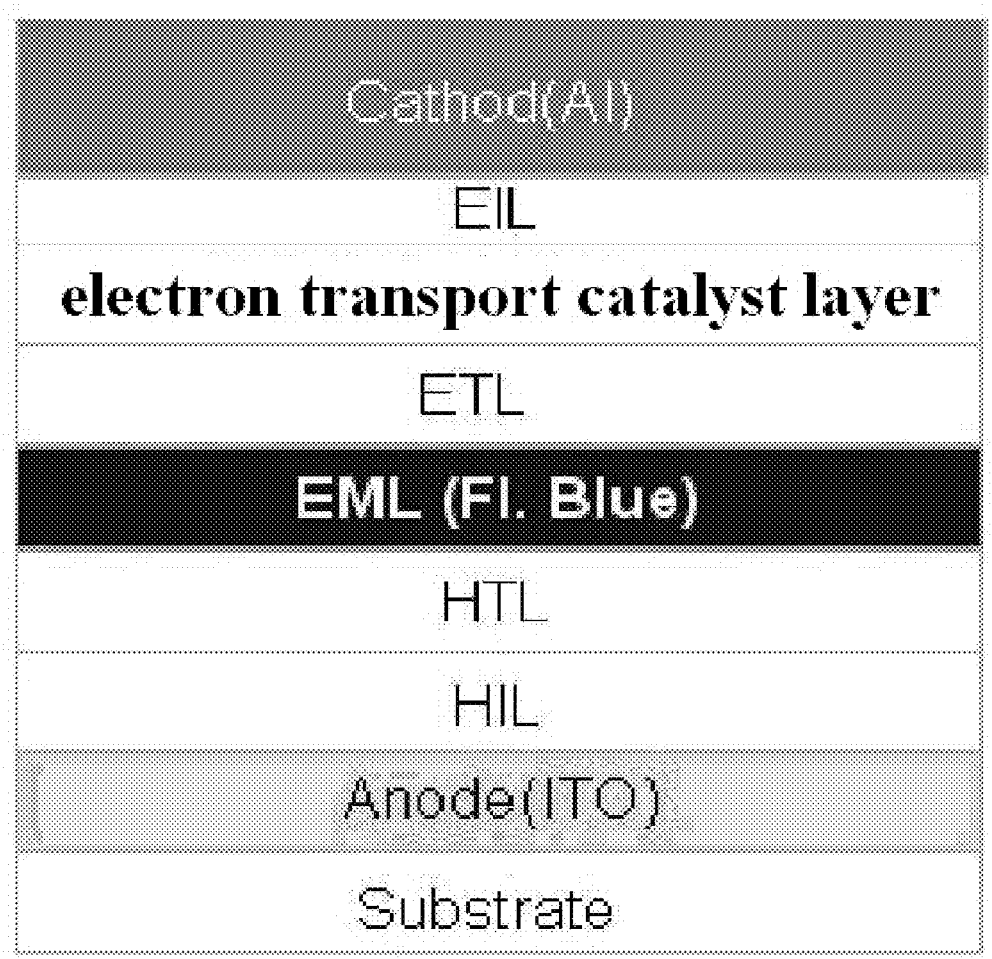

FIG. 9a and FIG. 9b are sectional views illustrating a single electron transport layer structure and a stack structure of an electron transport layer and an electron transport catalyst layer in an organic light emitting device that includes a blue fluorescent light emitting layer.

In the stack structure that includes a blue fluorescent light emitting layer, the case where the single electron transport layer (ETL) is provided as shown in FIG. 9a is compared with the case where the stack structure of the electron transport layer (ETL)/electron transport catalyst layer as shown in FIG. 9b. In this case, as shown in Table 5, for charge valence and TTA(triplet-triplet annihilation), the electron transport layer (ETL) and the hole transport layer (HTL) having high triplet energy are applied to the boundary of the blue fluorescent light emitting layer (EML) (Fl. Blue), and the electron transport catalyst layer having good electron mobility is deposited on the electron transport layer (ETL). In this case, the best IVL property is obtained in the stack structure of the electron transport layer (ETL)/electron transport catalyst layer.

In other words, as shown in Table 5, as a result of the experiment performed by varying the thickness of the electron transport layer and the electron transport catalyst layer, when the electron transport layer and the electron transport catalyst layer are deposited at thickness of 150 Å/150 Å, respectively, it is noted that the best quantum efficiency of 9.7%, high light intensity of 9.3 cd/A, and relatively low driving voltage are obtained.

TABLE 5

| ID | ETL(Å) | Catalyst layer(Å) | Volt(V) | Cd/A | EQE(%) | CIEx | CIEy |
|---|---|---|---|---|---|---|---|
| a | | 300 | 3.7 | 5.6 | 5.9 | 0.132 | 0.135 |
| b | 50 | 250 | 4.0 | 7.0 | 7.4 | 0.132 | 0.137 |
| c | 100 | 200 | 4.1 | 8.9 | 9.3 | 0.132 | 0.138 |
| d | 150 | 150 | 4.1 | 9.3 | 9.7 | 0.132 | 0.138 |
| e | 300 | | 5.1 | 8.9 | 8.9 | 0.132 | 0.145 |

Figure 10:
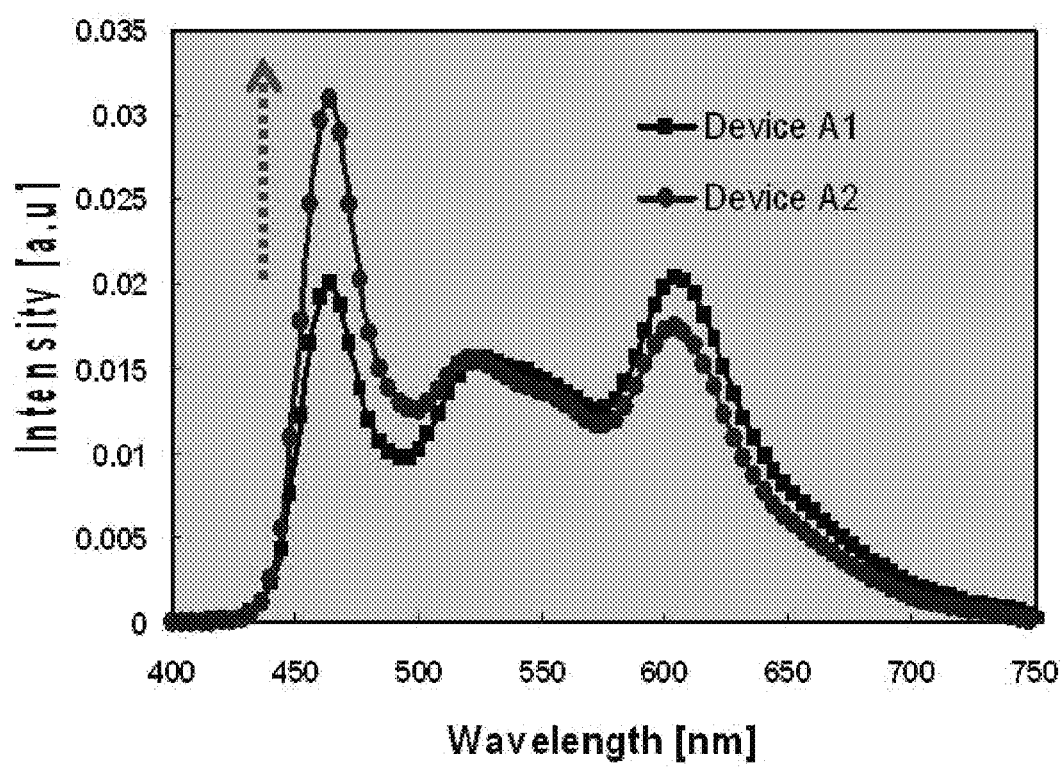
FIG. 10 is a graph illustrating a spectrum according to wavelength in a single electron transport layer structure and a stack structure of an electron transport layer and an electron transport catalyst layer of a white organic light emitting device according to the present invention.
Figure 11:
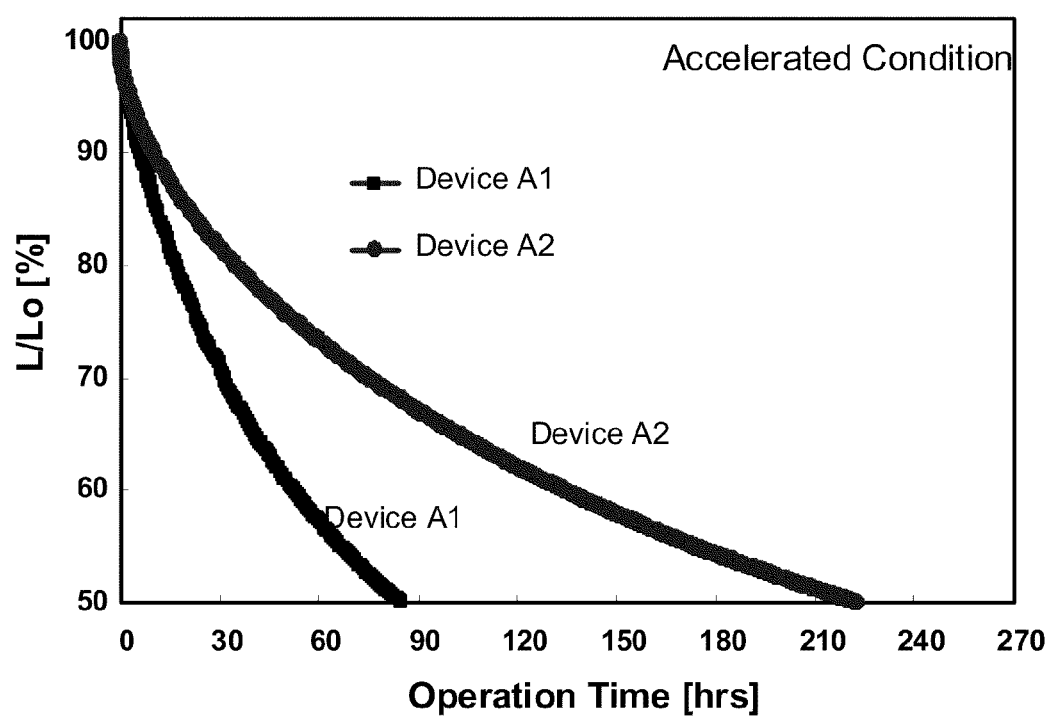
FIG. 11 is a graph illustrating lifespan in a single electron transport layer structure and a stack structure of an electron transport layer and an electron transport catalyst layer of a white organic light emitting device according to the present invention.

FIG. 10 is a graph illustrating a spectrum according to wavelength in a single electron transport layer structure and a stack structure of an electron transport layer and an electron transport catalyst layer of a white organic light emitting device according to the present invention. Also, FIG. 11 is a graph illustrating lifespan in a single electron transport layer structure and a stack structure of an electron transport layer and an electron transport catalyst layer of a white organic light emitting device according to the present invention.

The white organic light emitting device has been fabricated with a stack structure of the electron transport catalyst layer doped with metal and the electron transport layer and a two-stack structure of the electron transport layer and the hole transport layer having high triplet energy. In this case, spectrum and IVL data are as shown in FIG. 10 and Device 2 of Table 6.

In the graph of FIG. 10, it is noted that intensity is increased to improve efficiency at a range of 450~500 nm corresponding to blue wavelengths in case of Device A2 expressed with blue. This means that efficiency of the blue fluorescent layer, which is more deteriorated than efficiency of the red/green phosphor light emitting layer, is improved in the two-stack structure.

In Table 6, it is noted that the driving voltage is increased in Device A2 but light intensity or current value is low, and the color coordinate system increases color temperature.

TABLE 6

| Structure | Volt(V) | lm/W | cd/A | CIEx | CIEy |
|---|---|---|---|---|---|
| Device A1 | 5.9 | 30 | 56.5 | 0.368 | 0.385 |
| Device A2 | 6.9 | 25 | 54.5 | 0.322 | 0.345 |

As shown in FIG. 11, it is noted that lifespan of the Device A2 is improved twice or more than that of the Device A1.

Figure 12:
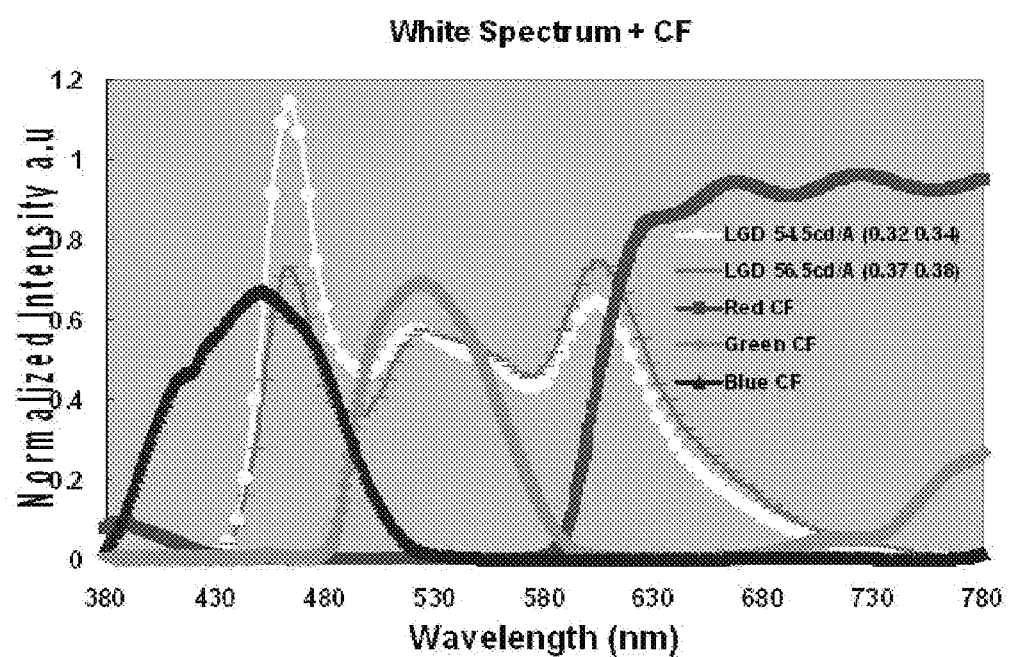
FIG. 12 is a graph illustrating luminance according to wavelength in case of a color filter layer in a white light emitting device according to the present invention.

FIG. 12 is a graph illustrating luminance according to wavelength in case of a color filter layer in a white light emitting device according to the present invention.

In FIG. 12, each spectrum of color filter R, G, B films is overlapped with each spectrum of Device A1 and Device A2. It is noted from Table 7 that consumed power is improved due to the improved fluorescence efficiency in the structure of Device A2 according to the present invention.

In other words, referring to Table 7, it is noted that red light intensity is lowered and blue light intensity is remarkably improved in the Device A2 when the Device A1 is compared with the Device A2. In particular, it is noted that consumed power is reduced from 52 W to 37.4 W corresponding to $2/3$.

TABLE 7

| | Device A1 | | | Device A2 | | |
|---|---|---|---|---|---|---|
| | cd/A | x | y | cd/A | x | y |
| White | 56.5 | 0.368 | 0.385 | 54.5 | 0.322 | 0.345 |
| Red | 7.9 | 0.675 | 0.323 | 6.7 | 0.673 | 0.324 |
| Green | 17.8 | 0.228 | 0.689 | 17.7 | 0.217 | 0.683 |
| Blue | 1.9 | 0.131 | 0.076 | 2.6 | 0.132 | 0.070 |
| Color gamut (%) | (xy) 97.9% (u'v') 103% | | | (xy) 98.1% (u'v') 106% | | |
| Power Consumption [1] | 52 W | | | 37.4 W | | |

Meanwhile, since the white organic light emitting device is important in view of color purity, color stability, optical properties such as color stability according to current and voltage, light emitting efficiency, lifespan, and easiness of fabrication, its various modes have been developed. Recently, a device that enhances internal quantum efficiency using both singlet excited state and triplet excited state by combining phosphorescence and fluorescence is being developed.

Also, a white organic light emitting device of high efficiency, which can obtain internal quantum efficiency of 100% by applying red, green and blue to phosphorescence, has been developed.

However, a white organic light emitting device of two-stack using blue fluorescence and red and green phosphorescence has been mainly developed until now due to a blue phosphor material that requires improvement in view of lifespan.

Also, the light emitting device has limitation in application to a large scaled display as power consumption increases due to the lifespan problem caused by limited efficiency of blue fluorescence.

The organic light emitting device of the present invention has the following advantages.

First of all, a hole layer having high triplet energy and a dual electron transport layer doped with metal are provided to enable triplet-triplet annihilation, improve efficiency of blue fluorescence and increase lifespan, whereby good color quality and low power consumption can be achieved.

In addition, when a white organic light emitting device is formed in a dual stack structure having a blue light emitting layer and green and red light emitting layers in each stack between an anode and a cathode, an energy level of a hole transport layer is set to be higher than an energy level of excited state by 0.01~0.4 eV in the light emitting layers of green and red, whereby exciton of the excited state is prevented from flowing to the hole transport layer. Accordingly, the hole transport layer serves as an exciton (singlet, triplet) blocking layer together with a hole transport function, whereby a separate exciton blocking layer is not provided. As a result, process steps are not increased and power consumption can be reduced. Moreover, components of singlet exciton and triplet exciton remaining in the light emitting layer are continuously used for light emission, whereby light emitting efficiency can be improved.

Moreover, one stack of a white organic light emitting device includes a blue fluorescent light emitting layer including a blue dopant and the other stack includes a red/green phosphor light emitting layer including a host material having green and red dopants at an appropriate amount. In this case, a uniform peak value and a distinct peak occur in each wavelength of red, green and blue, whereby a color reproduction rate can be increased in case of application of a color filter.

Since the electron transport layer includes a hole layer having high triplet energy and an electron transport catalyst layer doped with metal, efficiency of blue fluorescence can be improved using triplet-triplet annihilation and lifespan can be increased, whereby color quality and low power consumption can be obtained.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A white organic light emitting device comprising:
an anode and a cathode facing each other on a substrate;
a charge generation layer formed between the anode and the cathode;
a first stack formed between the anode and the charge generation layer in a stack structure of a first hole transport layer, a first light emitting layer emitting blue, a first electron transport layer and an electron transport catalyst layer doped with metal; and
a second stack formed between the charge generation layer and the cathode in a stack structure of a second hole transport layer, a second light emitting layer, and a second electron transport layer, the second light emitting layer doped with phosphor red and green dopants in one host, and the second hole transport layer having an energy level higher than a triplet exciton energy level of the second light emitting layer.

2. The white organic light emitting device of claim 1, wherein the second hole transport layer is set to energy level higher than the triplet exciton energy level of the second light emitting layer as much as 0.01~0.4 eV.

3. The white organic light emitting device of claim 2, wherein the first hole transport layer is set to energy level higher than a triplet exciton energy level of the first light emitting layer as much as 0.01~0.4 eV.

4. The white organic light emitting device of claim 3, wherein the first electron transport layer is set to energy level higher than the triplet exciton energy level of the first light emitting layer as much as 0.01~0.4 eV, and the second electron transport layer is set to energy level higher than the triplet exciton energy level of the second light emitting layer as much as 0.01~0.4 eV.

5. The white organic light emitting device of claim 1, wherein the first light emitting layer includes a blue host having a blue dopant emitting blue.

6. The white organic light emitting device of claim 1, wherein the first electron transport catalyst layer is selected from a material that minimizes metal diffusion to the first light emitting layer and has high triplet energy level, and the first electron transport layer is selected from an organic matter that enables electron injection through metal doping.

7. The white organic light emitting device of claim 6, wherein the first electron transport layer is a bphen based organic matter.

8. The white organic light emitting device of claim 1, wherein the metal doped in the electron transport catalyst layer includes at least any one of alkali metal, MoOx, WOx, and $V_2O_5$.

9. The white organic light emitting device of claim 1, wherein the first stack has lifespan longer than that of the second stack, and the white organic light emitting device has cool white color property according to aging.

* * * * *